(12) United States Patent
Ohshima et al.

(10) Patent No.: US 7,952,180 B2
(45) Date of Patent: May 31, 2011

(54) INTEGRATED CIRCUIT, INTERFACE CIRCUIT USED IN THE INTEGRATED CIRCUIT, AND APPARATUS USING THE INTEGRATED CIRCUIT

(75) Inventors: Atsushi Ohshima, Kanagawa-ken (JP); Toshiki Kishioka, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 2030 days.

(21) Appl. No.: 10/936,240

(22) Filed: Sep. 8, 2004

(65) Prior Publication Data
US 2005/0052215 A1 Mar. 10, 2005

(30) Foreign Application Priority Data
Sep. 9, 2003 (JP) ................................. 2003-316765

(51) Int. Cl.
*H01L 23/02* (2006.01)
*H01L 23/34* (2006.01)
(52) U.S. Cl. ........................................ 257/685; 257/723
(58) Field of Classification Search .................. 257/685, 257/723, E23.085
See application file for complete search history.

(56) References Cited

FOREIGN PATENT DOCUMENTS

| JP | 6-61746 | * | 3/1994 |
| JP | 11-340421 | * | 12/1999 |
| JP | 2000-3563 | * | 1/2000 |
| JP | 2000-134082 | | 5/2000 |

OTHER PUBLICATIONS

June 17, 2008 official action in connection with a counterpart Japanese patent application No. 2003-316765.*

* cited by examiner

*Primary Examiner* — Cuong Q Nguyen
(74) *Attorney, Agent, or Firm* — Cooper & Dunham LLP

(57) ABSTRACT

An integrated circuit having an MCM structure, an interface circuit used in the integrated circuit, and an apparatus incorporating the integrated circuit are disclosed. The integrated circuit includes at least two semiconductor devices formed on a common substrate. The semiconductor devices are interconnected via an interface circuit, capable of converting a single-ended signal received from one semiconductor device to a differential signal, and providing the differential signal to another semiconductor device. The interface circuit includes a pair of bonders, which physically connect the semiconductor devices.

35 Claims, 6 Drawing Sheets

INTEGRATED CIRCUIT, INTERFACE CIRCUIT USED IN THE INTEGRATED CIRCUIT, AND APPARATUS USING THE INTEGRATED CIRCUIT

BACKGROUND

1. Field

The present invention relates to an integrated circuit having a MCM (multichip module) structure, an interface circuit used in the integrated circuit, and an apparatus incorporating the integrated circuit.

2. Discussion of the Background

The MCM technology provides two or more semiconductor devices interconnected on a common substrate. Benefits of using the MCM technology include, for example, reduced circuit sizes, fewer and shorter interconnects, higher transmission speeds, reduced EMI (electromagnetic interference) emissions, reduced crosstalk noises, and highly flexible packaging designs.

FIG. 1 illustrates a background integrated circuit 100, having an MCM structure, in which a semiconductor device 100A and a semiconductor device 100B are formed on a common substrate.

As shown in FIG. 1, the semiconductor device 100A and the semiconductor device 100B are connected to each other via an interface circuit 103.

The interface circuit 103 includes, for example, a pair of TTL (transistor-transistor logic) or CMOS (complementary metal oxide semiconductor) circuits, with each pair including two I/O (input/output) circuits. The interface circuit 103 passes a digital signal, that is, a single-ended signal, received from a digital circuit 106 or a digital/analog circuit 107 to the digital/analog circuit 107 or the digital circuit 106.

The use of the single-ended signal, however, may cancel out some of the benefits offered by the MCM technology. For example, the single-ended signal usually suffers from high EMI emissions, high crosstalk noises, lower transmission speeds, and limited packaging designs.

SUMMARY OF THE INVENTION

This patent specification describes a novel integrated circuit having an MCM structure, a novel interface circuit used in the integrated circuit, and an apparatus incorporating the integrated circuit.

In one example, the integrated circuit includes at least two semiconductor devices formed on a common substrate, including a first semiconductor device and a second semiconductor device. The first and second semiconductor devices are connected to each other via an interface circuit, interposed between them. The interface circuit converts a single-ended signal received from the first semiconductor device or the second semiconductor device to a differential signal, and provides the differential signal to the second semiconductor device or the first semiconductor device.

The novel integrated circuit may be used in wide applications, for example, as an optical disc apparatus and an image forming apparatus.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
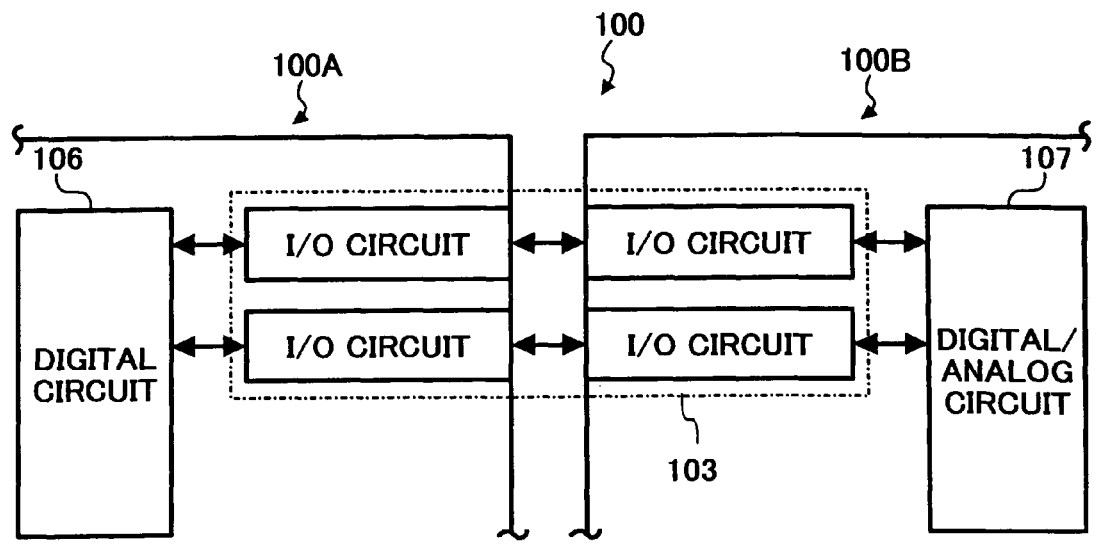
FIG. 1 is a schematic block diagram illustrating a background integrated circuit having an MCM structure.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIG. 2, a description is made for an integrated circuit 1 according to a preferred embodiment of the present invention.

The integrated circuit 1 has an MCM structure, in which a semiconductor device 1A and a semiconductor device 1B are formed on a common substrate.

The semiconductor device 1A including a digital circuit 6, and the semiconductor device 1B including a digital/analog circuit 7, are connected to each other via an interface circuit 10.

The interface circuit 10 includes a pair of LVDS (low voltage differential signal) circuits 8, 9.

The LVDS circuit 8 includes a first driver circuit 2 formed on the first semiconductor device 1A, and a first receiver circuit 5 formed on the second semiconductor device 1B.

In operation, the digital circuit 6 outputs a digital signal, that is, a single-ended signal, to the first driver circuit 2. The first driver circuit 2 converts the received digital signal to a differential signal, and outputs it to the first receiver circuit 5. The first receiver circuit 5 converts the received differential signal back to a digital signal, that is, a single-ended signal, and provides it to the digital/analog circuit 7.

The LVDS circuit 9 includes a second receiver circuit 3 formed on the first semiconductor device 1A, and a second driver circuit 9 formed on the second semiconductor device 1B.

In operation, the second driver circuit 4 converts a digital signal, that is, a single-ended signal, received from the digital/analog circuit 7, to a differential signal. The second receiver circuit 3 receives the differential signal from the second driver circuit 4, and converts it back to a digital signal, that is, a single-ended signal. The digital signal is then output to the digital circuit 6.

Figure 2:
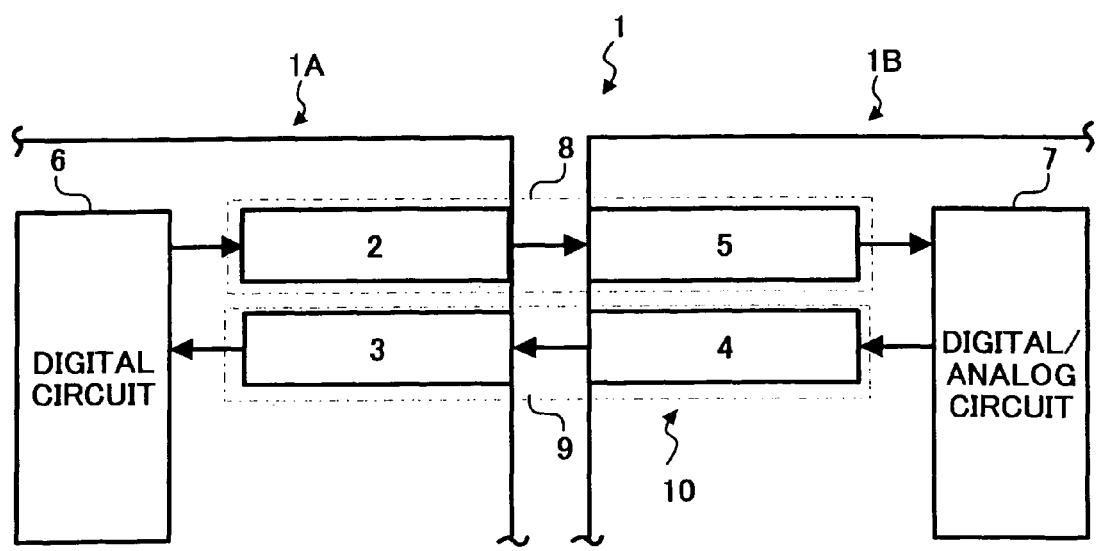
FIG. 2 is a schematic block diagram illustrating an integrated circuit having an MCM structure, according to a preferred embodiment of the present invention.
Figure 3:
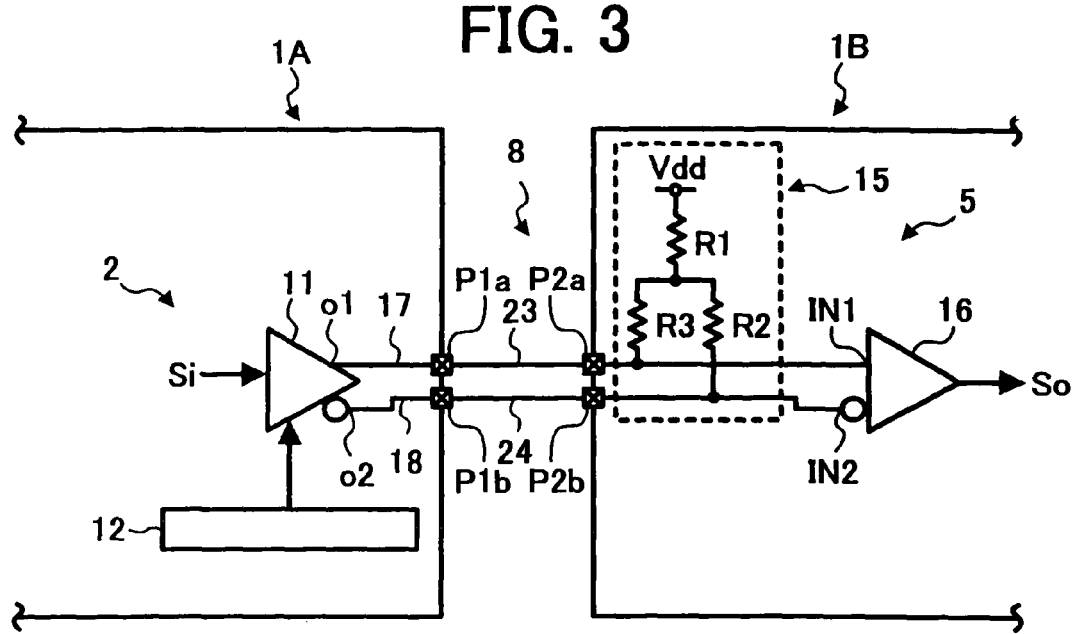
FIG. 3 is a schematic circuit diagram illustrating an interface circuit shown in FIG. 2.

FIG. 3 illustrates an exemplary circuit structure of the LVDS circuit 8 and its circumferential circuits, shown in FIG. 2. Although not shown, the LVDS circuit 9 has a mirror configuration of the circuit structure of FIG. 3.

As shown in FIG. 3, the LVDS circuit 8 includes a signal line 17 and a signal line 18. The signal line 17 includes a connection pad P1a formed on the semiconductor device 1A, a connection pad P2a formed on the semiconductor device 1B, and a bonder 23 placed between the connection pads P1a and P2a. The signal line 18 includes a connection pad P1b formed on the semiconductor device 1A, a connection pad P2b formed on the semiconductor device 1B and a bonder 24 placed between the connection pads P1b and P2b.

The bonders 23 and 24 may by prepared using a variety of techniques, including the wire bonding technique and the flip-flop bonding technique, for example. As shown in FIG. 3, the bonders 23 and 24 are partially formed outside of the semiconductor devices 1A and 1B, respectively.

FIG. 3 also illustrates a driver 11 of the driver circuit 2, a current generator 12 of the driver circuit 2, a receiver 16 of the receiver circuit 5, and a current/voltage converter 15 of the receiver circuit 5.

The driver 11 has an output node o1 connected to one end (toward the semiconductor device 1A) of the signal line 17, and an output node o2 connected to one end (toward the semiconductor device 1A) of the signal line 18.

The receiver 16 has an input node IN1 connected to the other end (toward the semiconductor device 1B) of the signal line 17, and an input node IN2 connected to the other end (toward the semiconductor device 1B) of the signal line 18.

The current generator 12, formed on the semiconductor device 1A, is connected to the driver 11.

The current/voltage converter 15 is interposed between the driver 11 and the receiver 16, and includes resistors R1, R2, and R3. As shown in FIG. 3, the resistor R1 and the resistor R3 are connected in series, the resistor R1 and the resistor R2 are connected in series, and the resistor R3 and the resistor R2 are connected in parallel. Further, the resistor R3 is connected to the signal line 17, and the resistor R2 is connected to the signal line 18.

In operation, the current generator 12 supplies the driver 11 with a fixed amount of current. The driver 11 generates a current signal according to a digital signal Si received from the digital circuit 6 (FIG. 2). The current/voltage converter 15 converts the generated current signal to a differential voltage signal, and outputs it to the receiver 16. The receiver 16 converts the differential voltage signal to a digital signal So, and outputs it to the digital/analog circuit 7 (FIG. 2).

Figure 4:
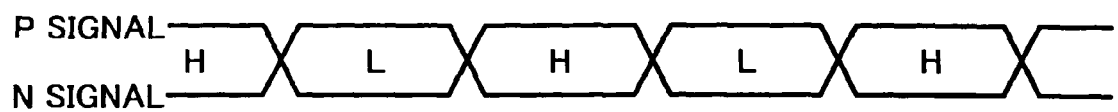
FIG. 4 is an illustration showing a differential signal.

More specifically, the driver 11 converts the digital signal Si to a differential signal, that is, a pair of signals that are inverse from one another, as shown in FIG. 4. The exemplary differential signal of FIG. 4 includes a positive signal ("P SIGNAL") and a negative signal ("N SIGNAL").

The driver 11 then determines whether the digital signal Si is a high level signal or a low level signal, according to the potential difference between the positive and negative signals.

For example, when the positive signal is higher in potential than the negative signal, the digital signal Si is interpreted as a high level signal (indicated as "H" in FIG. 4). When the positive signal is lower in potential than the negative signal, the digital signal is interpreted as a low level signal (indicated as "L" in FIG. 4).

When the driver 11 determines that the digital signal Si is a high level signal, the output node o1 becomes high impedance and causes a current to flow into the output node o2. As a result, the voltage at the input node IN1 becomes higher than the voltage at the input node IN2. Based on this voltage difference, the receiver 16 generates the digital signal So of high level.

On the other hand, when the driver 11 determines that the digital signal Si is a low level signal, the output node o2 becomes high impedance and causes a current to flow into the output node o1. As a result, the voltage at the input node IN2 becomes higher than the voltage at the input node IN1. Based on this voltage difference, the receiver 16 generates the digital signal So of low level.

The structure and design of the interface circuit 8 or 9 depends on the desired level of reliability and speed in signal transmission.

For example, in order to reduce skew in signals and thus increase reliability, the signal line 17 and the signal line 18 should have substantially same electrical lengths. In other words, the bonder 23 and the bonder 24 have substantially same physical lengths, as shown in FIG. 5.

Figure 5:
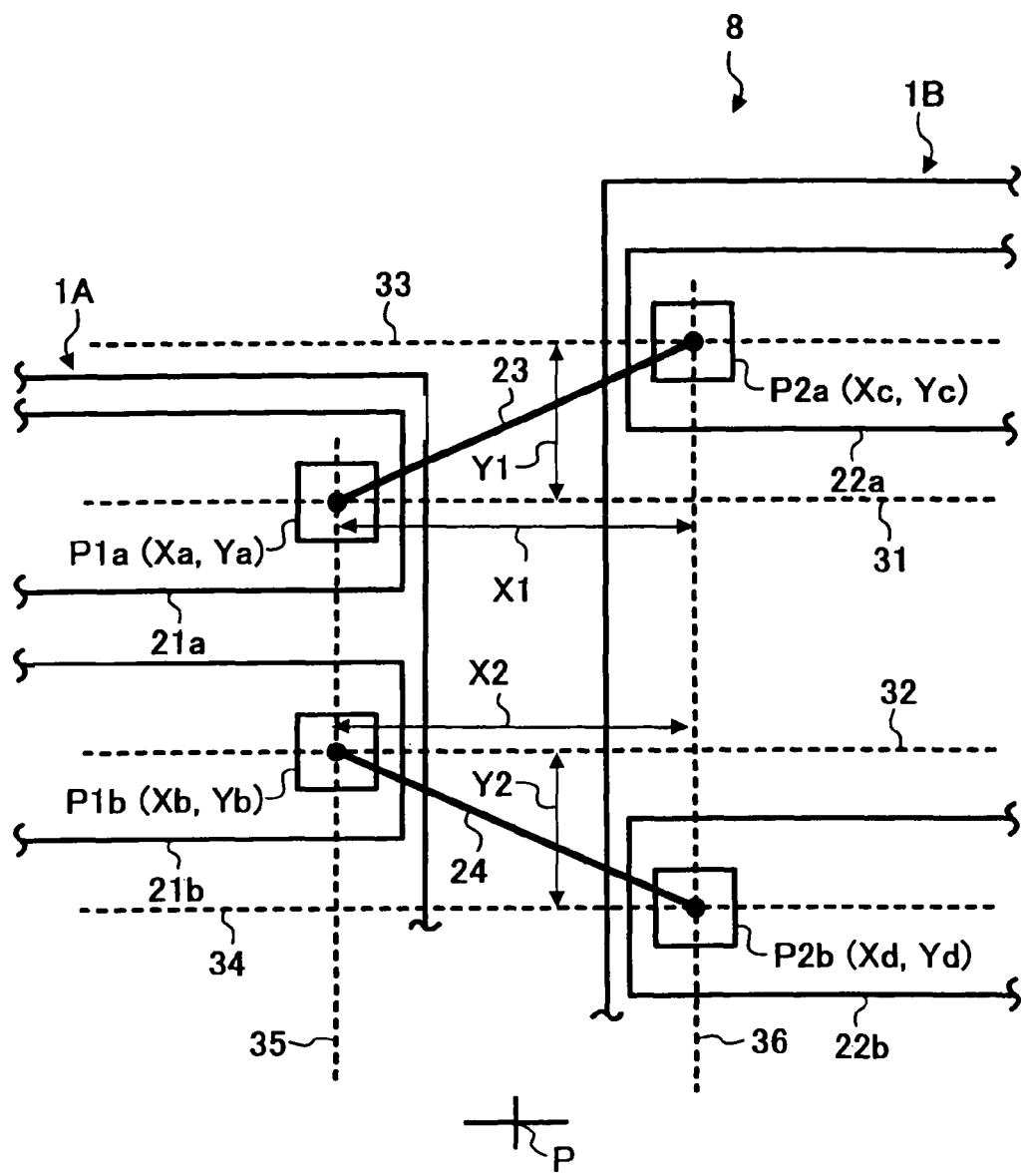
FIG. 5 is a schematic diagram illustrating an exemplary layout of the interface circuit shown in FIG. 3.

Referring to FIG. 5, the connection pads P1a, P1b, P2a, and P2b are formed on I/O (input output) cells 21a, 21b, 22a, and 22b, respectively.

The connection pads P1a and P1b are arranged such that the horizontal axis 31 intersecting the connection pad P1a perpendicularly at the central point of the pad P1a, and the horizontal axis 32 intersecting the connection pad P1b perpendicularly at the central point of the pad P1b, are parallel to each other, and the vertical axis 35 intersects the connection pads P1a and P1b perpendicularly at the respective central points of the pads P1a and P1b.

Further, the connection pads P2a and P2b are arranged such that the horizontal axis 33 intersecting the connection pad P2a perpendicularly at the central point of the pad P2a, and the horizontal axis 34 intersecting the connection pad P2b perpendicularly at the central point of the pad P2b are parallel to each other, and the vertical axis 36 intersects the connection pads P2a and P2b perpendicularly at the respective central points of the pads P2a and P2b.

Furthermore, the pair of the connection pads P1a and P1b and the pair of the connection pads P2a and P2b are arranged such that the vertical axis 35 and the vertical axis 36 are parallel to each other.

If the horizontal axis and the vertical axis are described as X and Y, respectively, the central point of the connection pad P1a may be described as (Xa, Ya) with respect to a reference point P. The central point of the connection pad P1b may be described as (Xb, Yb) with respect to the reference point P. The central point of the connection pad P2a may be described as (Xc, Yc) with respect to the reference point P. The central point of the connection pad P2b may be described as (Xd, Yd) with respect to the reference point P.

The reference point P is located preferably between the semiconductor device 1A and the semiconductor device 1B as shown in FIG. 5, however, its location is not limited to such example, as long as it can act as a reference point. Accordingly, the vertical axes 35 and 36, and the horizontal axes 31, 32, 33 and 34, may be described as horizontal axes 35 and 36, and vertical axes 31, 32, 33 and 34, depending on the location of the reference point P.

In order to make the length of the bonder 23 and the length of the bonder 24 substantially same, the four connection pads P1a, P1b, P2a, and P2b should be arranged such that the difference between Xa and Xc ("X1" in FIG. 5) and the difference between Xb and Xd ("X2" in FIG. 5) are substantially same in length. At the same time, the difference between Ya and Yc ("Y1" in FIG. 5) and the difference between Yb and Yd ("Y2" in FIG. 5) are substantially same in length. In this case, the difference is calculated in absolute values.

Figure 6:
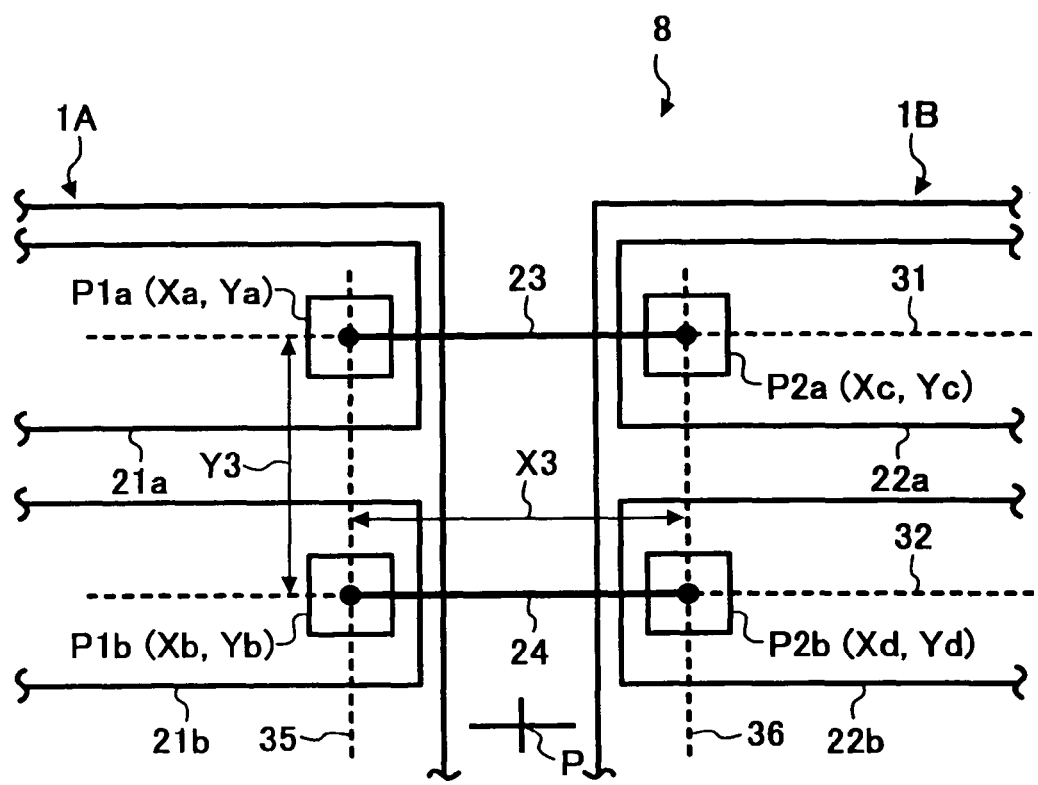
FIG. 6 is a schematic diagram illustrating another exemplary layout of the interface circuit shown in FIG. 3.

In another example, the transmission speed in signals may be increased. In such a case, the signal line 17 and the signal line 18 should have shorter electrical lengths, as shown in FIG. 6. In other words, the four connection pads P1a, P1b, P2a, and P2b are arranged such that Y1 and Y2 of FIG. 5 both become 0, and X1 and X2 correspond to the physical lengths (indicated as "X3" in FIG. 6) of the bonders 23 and 24, respectively. Here, the physical lengths of the bonders 23 and 24 are substantially same.

The length X3 may be defined according to a rule to be used for fabricating the integrated circuit 1. This fabrication rule includes, for example, a process rule that specifies a length and/or thickness of the bonders 23 or 24, and an assembly rule that specifies packaging of the semiconductor device 1A and 1B.

For example, the physical length X3 ranges from 90 μm to 100 mm, if the 0.25 μm process rule is applied.

In addition, the difference between Ya and Yb, or the difference between Yc and Yd, (indicated as "Y3" in FIG. 6) may be defined according to the fabrication rule.

Integrated circuits of the present invention, including the integrated circuit 1 of FIG. 2, may be applied in various forms, as an optical disc apparatus, a communications apparatus, an information processing apparatus, an image forming apparatus, a digital camera, etc.

Figure 7:
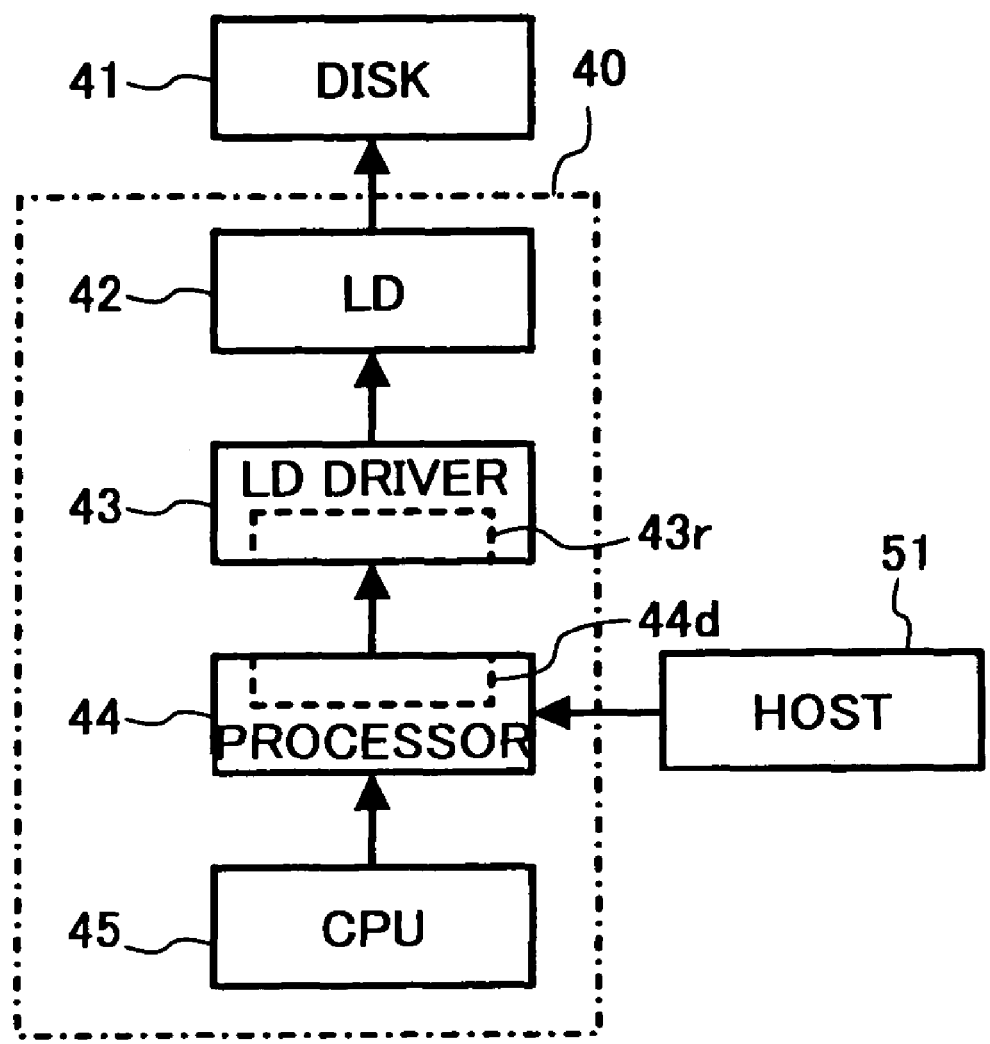
FIG. 7 is a schematic block diagram illustrating an optical disc apparatus incorporating an integrated circuit of the present invention.

FIG. 7 illustrates an exemplary structure of an optical disc apparatus 40 incorporating any one of the above-described and other integrated circuits of the present invention.

As shown in FIG. 7, the optical disc apparatus 40 mainly includes an LD (laser diode) 42, an LD driver 43, a processor 44, and a CPU (central processing unit) 45. The optical disc apparatus 40 is connected to a host apparatus 51, such as a personal computer. Further, the optical disc apparatus 40 may be provided with an optical disc 41, which may be mounted on the optical disc apparatus 40.

In one example, the optical disc apparatus 40 writes data received from the host apparatus 51 onto the optical disc 41, under control of the host apparatus 51. In another example, the optical disc apparatus 40 reads data from the optical disc 41, and provides it to the host apparatus 51.

The LD 42 irradiates a laser beam onto the optical disc 41 to write or read data. The LD driver 43 controls the amount of laser beam of the LD 42, according to a signal output from the CPU 45. The processor 44 includes an encoder and/or a decoder, for example, and applies signal processing to the data, according to a signal output from the CPU 45. The CPU 45 controls an entire operation of the optical disc apparatus 40. The optical disc apparatus 40 may include other devices and/or functions, as will be apparent to those skilled in the art.

In this example, the LD driver 43 and the processor 44 includes any one of the above-described and other integrated circuits of the present invention.

More specifically, the LD driver 43 includes a receiver circuit 43r, and the processor 44 includes a driver circuit 44d. The pair of the receiver circuit 43r and the driver circuit 44d has a structure substantially similar to that shown in FIG. 3. Thus, the receiver circuit 43r functions as the receiver circuit 5 of FIG. 3, and the driver circuit 44d functions as the driver circuit 2 of FIG. 3.

Figure 8:
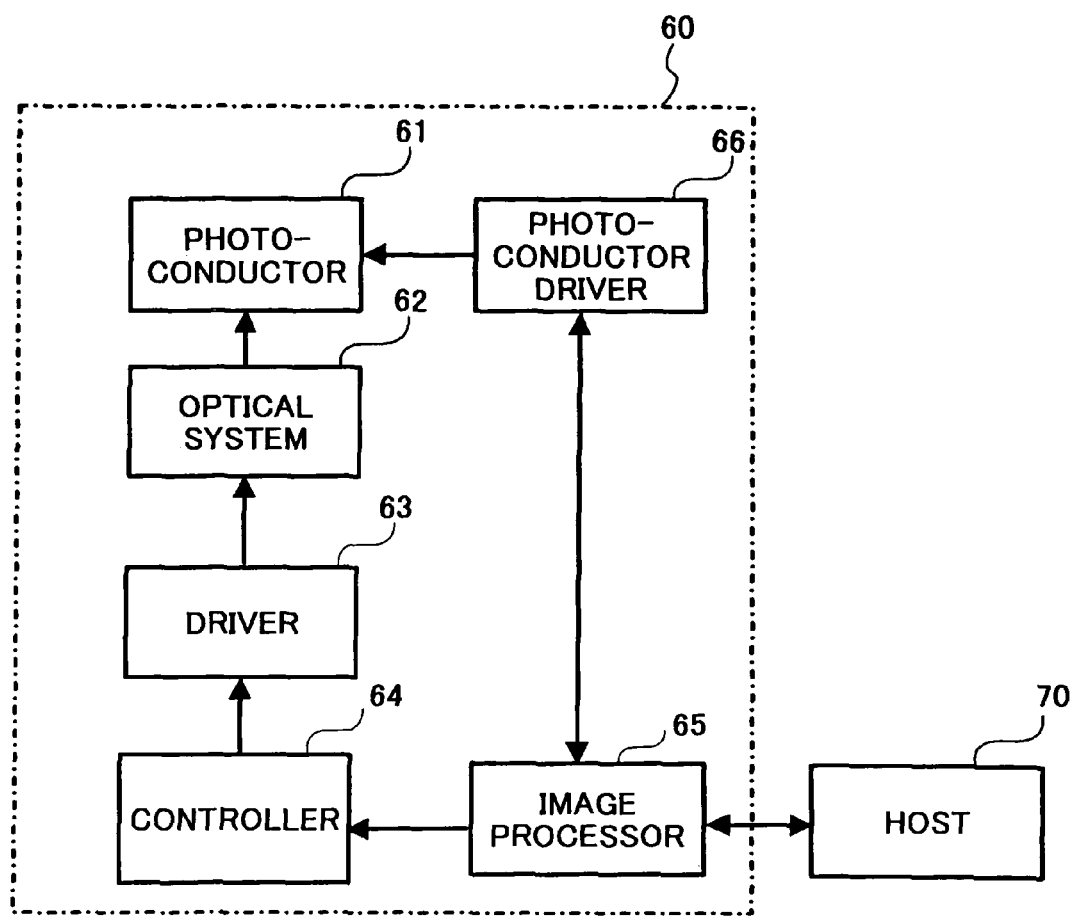
FIG. 8 is a schematic block diagram illustrating an image forming apparatus incorporating an integrated circuit of the present invention.

FIG. 8 illustrates an exemplary structure of an image forming apparatus 60 incorporating any one of the above-described and other integrated circuits of the present invention.

As shown in FIG. 8, the image forming apparatus 60 mainly includes a photoconductor 61, an optical system 62, a driver 63, a controller 64, an image processor 65, and a photoconductor driver 66.

In one example, the image forming apparatus 60 forms an image on the photoconductor 61, according to data received from a host apparatus 70, under control of the host apparatus 70.

The optical system 62 includes a semiconductor laser, which irradiates a laser beam onto the photoconductor 61 to form a latent image on the photoconductor 61. The driver 63 controls the laser beam of the optical system 62, according to a pulse signal output from the controller 64. The controller 64 includes a pulse generator, which generates the pulse signal according to a control signal output from the image processor 65. The photoconductor driver 66 drives the photoconductor 61, according to a control signal output from the image processor 65. Through the control signals output from the image processor 65, the photoconductor 61 and the optical system 62 operate in a synchronized manner to accurately form a latent image. The image forming apparatus 60 may include other devices and/or functions, as will be apparent to those skilled in the art.

In this example, the driver 63 and the controller 64 includes any one of the above-described and other integrated circuits of the present invention.

Numerous additional modifications and variations are possible in light of the above teachings. It is therefore to be understood that within the scope of the appended claims, the disclosure of this patent specification may be practiced otherwise than as specifically described herein.

For example, any kind of integrated circuits may be applied to the present invention, as long as it has an MCM structure, in which more than two semiconductor devices, formed on a common substrate, are interconnected via an interface circuit capable of converting a single-ended signal to a differential signal.

This patent specification is based on Japanese patent application, No. 2003-316765 filed on Sep. 9, 2003, in the Japanese Patent Office, the entire contents of which are incorporated by reference herein.

What is claimed is:

1. An integrated circuit comprising:
a first semiconductor device formed on a substrate;
a second semiconductor device formed on the substrate; and
an interface circuit configured to connect the first semiconductor device and the second semiconductor device, to convert first and third single-ended signals received from the first and second semiconductor devices, respectively, to first and second differential signals, and to convert the first and second differential signals back to second and fourth single-ended signals.

2. The integrated circuit of claim 1, wherein the first semiconductor device comprises a first circuit configured to output the first single-ended signal to the interface circuit and receive the fourth single-ended signal from the interface circuit,
and wherein the second semiconductor device comprises a second circuit configured to output the third single-ended signal to the interface circuit and receive the second differential signal from the interface circuit.

3. The integrated circuit of claim 2, wherein the interface circuit comprises at least a pair of LVDS (low voltage differential signal) circuits, including a first LVDS circuit and a second LVDS circuit.

4. The integrated circuit of claim 3, wherein the first LVDS circuit comprises:
a first driver circuit formed on the first semiconductor device and configured to convert the first single-ended signal received from the first circuit to the first differential signal; and
a first receiver circuit formed on the second semiconductor device and configured to convert the first differential signal received from the first driver circuit back to the second single-ended signal and output the second single-ended signal to the second circuit, and wherein the second LVDS circuit comprises:
a second driver circuit formed on the second semiconductor device and configured to convert the third single-ended signal received from the second circuit to the second differential signal; and
a second receiver circuit formed on the first semiconductor device and configured to convert the second differential signal received from the second driver circuit back to the fourth single-ended signal and output the fourth single-ended signal to the first circuit.

5. The integrated circuit of claim 4, wherein the first driver circuit comprises:
a first driver formed on the first semiconductor device;
a first current generator formed on the first semiconductor device and connected to the first driver;
a first receiver formed on the second semiconductor device;
a first current/voltage converter formed on the second semiconductor device and interposed between the first driver and the first receiver; and
a first signal line pair interposed between the first driver and the current/voltage converter,
and wherein the second LVDS circuit further comprises:
a second driver formed on the second semiconductor device;
a second current generator formed on the second semiconductor device and connected to the second driver;
a second receiver formed on the first semiconductor device;
a second current/voltage generator formed on the first semiconductor device and interposed between the second driver and the second receiver; and
a second signal line pair interposed between the second driver and the second receiver.

6. The integrated circuit of claim 5, wherein the first signal line pair comprises a first connection pad pair formed on the first semiconductor device, a second connection pad pair formed on the second semiconductor device, and a first bonding pair interposed between the first and second connection pad pairs,
and wherein the second signal line pair comprises a third connection pad pair formed on the first semiconductor device, a fourth connection pad pair formed on the second semiconductor device, and a second bonding pair interposed between the third and fourth connection pad pairs.

7. The integrated circuit of claim 6, wherein the first and second bonding pairs are formed partially outside of the first semiconductor device and the second semiconductor device.

8. The integrated circuit of claim 7, wherein each of the first and second bonding pairs comprises two bonders having substantially same lengths.

9. The integrated circuit of claim 8, wherein the two bonders have minimum lengths, defined according to a fabrication rule.

10. The integrated circuit of claim 9, wherein the fabrication rule comprises:
a process rule configured to specify the lengths and thicknesses of the two bonders; and
an assembly rule configured to specify packaging of the first and second semiconductor devices.

11. The integrated circuit of claim 8, wherein the two bonders are prepared using the wire bonding technique.

12. The integrated circuit of claim 8, wherein the two bonders are prepared using the flip-chip bonding technique.

13. The integrated circuit of claim 5, wherein the first current/voltage converter comprises a first plurality of resistors,
and the second current/voltage generator comprises a second plurality of resistors.

14. An interface circuit connecting at least two semiconductor devices formed on a common substrate, the interface circuit comprising:
a driver circuit configured to convert a first single-ended signal received from one semiconductor device to a differential signal; and
a receiver circuit configured to convert the differential signal back to a second single-ended signal and output the second single-ended signal to another semiconductor device.

15. The interface circuit of claim 14, wherein the driver circuit and the receiver circuit are formed on different semiconductor devices.

16. The interface circuit of claim 15, wherein the driver circuit comprises:
a driver configured to generate a current signal according to the first single ended-signal;
a current generator connected to the driver and configured to provide a fixed amount of current to the driver,
and wherein the receiver circuit comprises:
a current/voltage converter connected to the driver and configured to convert the current signal to a differential voltage signal; and
a receiver connected to the current/voltage converter and configured to convert the differential voltage signal to the second single-ended signal.

17. The interface circuit of claim 16, wherein the driver comprises a first output node and a second output node,
and the receiver comprises a first input node and a second output node.

18. The interface circuit of claim 17, wherein the first output node and the first input node are connected via a first signal line, and the second input node and the second output node are connected via a second signal line.

19. The interface circuit of claim 18, wherein the first signal line comprises a first bonder, and the second signal line comprises a second bonder.

20. The interface circuit of claim 19, wherein a length of the first bonder and a length of the second bonder are made substantially same, by arranging the first, second, third, and fourth connection pad pairs, respectively.

21. The interface circuit of claim 20, wherein the length of the first bonder and the length of the second bonder are kept at minimum values defined by a fabrication rule, by arranging the first, second, third, and fourth connection pad pairs, respectively.

22. The interface circuit of claim 21, wherein the fabrication rule comprises:
a process rule configured to specify the lengths and thicknesses of the first and second bonders; and
an assembly rule configured to specify packaging of the first and second semiconductor devices.

23. The interface circuit of claim 19, wherein the first bonder and the second bonder are prepared, using the wire bonding technique.

24. The interface circuit of claim 19, wherein the first bonder and the second bonder are prepared, using the flip-chip bonding technique.

25. An apparatus, comprising an integrated circuit,
wherein the integrated circuit comprises:
a first semiconductor device formed on a substrate;

a second semiconductor device formed on the substrate; and an interface circuit configured to connect the first semiconductor device and the second semiconductor device, to convert first and third single-ended signals received from the first and second semiconductor devices, respectively, to first and second differential signals, and to convert the first and second differential signals back to second and fourth single-ended signals.

26. The apparatus of claim 25, wherein the first semiconductor device comprises a first circuit configured to output the first single-ended signal to the interface circuit and receive the fourth single-ended signal from the interface circuit, and wherein the second semiconductor device comprises a second circuit configured to output the third single-ended signal to the interface circuit and receive the second differential signal from the interface circuit.

27. The apparatus of claim 26, wherein the interface circuit comprises at least two bonders configured to connect the first semiconductor device and the second semiconductor device.

28. The apparatus of claim 27, wherein lengths of the at least two bonders are made substantially same, by arranging first, second, third, and fourth connection pad pairs.

29. The apparatus of claim 28, wherein the lengths of the at least two bonders are kept minimum according to a fabrication rule, by arranging first, second, third, and fourth connection pad pairs.

30. The apparatus of claim 29, wherein the fabrication rule comprises:
a process rule configured to specify the lengths and thicknesses of the two bonders; and
an assembly rule configured to specify packaging of the first and second semiconductor devices.

31. The apparatus of claim 25, further comprising:
a light source configured to provide a light onto an optical disc to read or write data from or onto the optical disc;
a controller configured to output a control signal;
a driver formed on the integrated circuit and configured to control an amount of the light according to the control signal; and
a processor formed on the integrated circuit and configured to apply signal processing to the data.

32. The apparatus of claim 25, further comprising:
a photoconductor configured to form an image thereon;
an optical system configured to provide a light onto the photoconductor;
an image processor configured to generate a control signal;
a photoconductor driver configured to drive the photoconductor according to the control signal;
a controller formed on the integrated circuit and configured to generate a pulse signal according to the control signal; and
a driver formed on the integrated circuit and configured to control an amount of the light according to the signal output from the controller.

33. An apparatus including an integrated circuit which comprises a first semiconductor device formed on a substrate, a second semiconductor device formed on the substrate, and interface means for connecting the first semiconductor device and the second semiconductor device, converting first and third single-ended signals received from the first and second semiconductor devices, respectively, to first and second differential signals, and converting the first and second differential signals back to second and fourth single-ended signals.

34. The apparatus of claim 33, further comprising:
light source means for supplying light onto an optical disc to read from, or write data onto, the optical disc;
control means configured to control an amount of the light supplied by the light source means; and
signal processing means for processing the data,
wherein said interface means connects said control means and said signal processing means.

35. The apparatus of claim 33, further comprising:
light source means for supplying light onto a photoconductor configured to form an image thereon;
controller means for generating a control signal for controlling an amount of the light supplied by the light source means;
driver means for driving the light source means according to the control signal from the controller means,
wherein said interface means connects said driver means and said controller means.

* * * * *